US008406007B1

(12) United States Patent
Folker et al.

(10) Patent No.: US 8,406,007 B1

(45) Date of Patent: Mar. 26, 2013

(54) MAGNETIC CIRCUIT BOARD CONNECTOR COMPONENT

(75) Inventors: Donald Folker, Madison, AL (US); Mike LeBlanc, Huntsville, AL (US); Mark Bauer, LaGuna Vista, TX (US)

(73) Assignee: Universal Lighting Technologies, Inc., Madison, AL (US)

(*) Notice: Subject to any disclaimer, the term of this patent is extended or adjusted under 35 U.S.C. 154(b) by 386 days.

(21) Appl. No.: 12/634,040

(22) Filed: Dec. 9, 2009

(51) Int. Cl.
*H05K 7/00* (2006.01)

(52) U.S. Cl. ........ 361/784; 361/760; 361/767; 361/719; 361/778; 361/810

(58) Field of Classification Search .................. 361/760, 361/767, 719, 784, 778, 810, 836
See application file for complete search history.

(56) References Cited

U.S. PATENT DOCUMENTS

| | | | | |
|---|---|---|---|---|
| 4,451,803 | A | 5/1984 | Holdsworth et al. | |
| 4,799,128 | A | 1/1989 | Chen | |
| 5,252,782 | A | 10/1993 | Cantrell et al. | |
| 6,128,817 | A | 10/2000 | Roessler et al. | |
| 6,342,778 | B1 | 1/2002 | Catalano et al. | |
| 6,353,379 | B1 | 3/2002 | Busletta et al. | |
| 7,088,211 | B2 | 8/2006 | Moncada et al. | |
| 7,295,094 | B2 | 11/2007 | Jitaru et al. | |
| 7,352,270 | B1 | 4/2008 | Copeland | |
| 2006/0238987 | A1* | 10/2006 | Park et al. | 361/748 |

* cited by examiner

*Primary Examiner* — Tuan T Dinh
*Assistant Examiner* — Hung Dang
(74) *Attorney, Agent, or Firm* — Waddey & Patterson, P.C.; Mark J. Patterson; Matthew C. Cox

(57) ABSTRACT

A magnetic component includes a bobbin structure adapted for attachment to a circuit board. The magnetic component may include a magnetically permeable core and a conductive winding. The bobbin structure may include a gap for inserting the edge of a circuit board. Potential applications of the magnetic component include mechanically and electrically interconnecting two or more circuit boards in a substantially side-by-side configuration while providing increased heat dissipation from the magnetic component, improving power density of the electronic device, reducing electronic device profile, allowing magnetic isolation between high-voltage and low-voltage circuits and allowing single-sided and double-sided circuit boards to be used in a single circuit. Also, a circuit board assembly may have two or more circuit boards electrically and mechanically connected by at least one magnetic component.

17 Claims, 6 Drawing Sheets

MAGNETIC CIRCUIT BOARD CONNECTOR COMPONENT

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application(s) which is/are hereby incorporated by reference: None

BACKGROUND OF THE INVENTION

The present invention relates generally to structures for mechanically and electrically interconnecting circuit boards using a circuit component. More particularly the present invention relates to magnetic circuit components such as a transformer having a bobbin structure adapted for electrically and mechanically interconnecting two or more circuit boards in a substantially side-by-side configuration.

Magnetic circuit components such as transformers and inductors are commonly used in a variety of electrical applications, including power supplies. Generally, a magnetic circuit component may include an electrically conductive winding positioned around a core made of a magnetically permeable material. Typically, a core is made of a ferrite. The conductive winding is positioned on a bobbin structure shaped for receiving the core. Additional conductive windings may be placed around the same core or bobbin structure. A second core may also be positioned near the conductive winding to form a closed-loop magnetic flux path around the bobbin structure. Each coil, or winding, may include one or more turns. The electrical characteristics of the component generally depend on the number of turns of each conductive winding and the relative placement of each winding around the core or cores.

Conventional magnetic circuit components are generally configured for surface mounting onto a circuit board using terminal connection pins extending from the component body. The connection pins are placed into holes on the surface of a circuit board and are soldered to electrical connection locations on the circuit board, thereby mechanically attaching the component to the circuit board while electrically connecting the component to the circuit. Typically, parts of the electric circuit to which a magnetic component is connected are printed directly onto a circuit board substrate, forming a printed circuit board.

A printed circuit board may be formed in several layers, each layer including a unique pattern of conductive material, known as a multi-layer printed circuit board. One common printed circuit board configuration includes a circuit pattern printed only on one side of a flat, two-sided circuit board, generally referred to as a single-sided printed circuit board. Another conventional printed circuit board configuration includes circuit patterns printed directly onto both sides of a circuit board substrate, typically known as a double-sided printed circuit board. Multi-layer and double-sided printed circuit boards require more expensive design, layout and fabrication processes than single-sided printed circuit boards, and it is thus desirable in the art to use single-sided printed circuit boards wherever possible to reduce cost. Many electronic applications and circuit components require the use of a multi-layer or double-sided circuit board either for optimal functionality or for obtaining a desired electronic device profile.

The prior art generally teaches the use of a single contiguous double-sided circuit board for an entire circuit in applications where any individual region of a circuit requires a double-sided circuit board. However, it is often desirable to separate one double-sided circuit board into multiple smaller single-sided circuit boards oriented in a side-by-side configuration to reduce costs. A multiple circuit board configuration, however, requires both electrical interconnection among boards and mechanical support between boards. Others have attempted to electrically interconnect adjacent single-sided, double-sided and multi-layer circuit boards in a single circuit using electrical and mechanical connectors between boards. Various types of electrical and mechanical connectors are known for such connection, including sockets, pins, cables, horizontal standoffs and spacers. However, these connector components add additional size, cost and complexity to electric circuits and electronic devices. Prior art connectors also add additional modes of device failure by increasing both the number of individual electrical connections that may become disconnected and the number of mechanical connections that may become dislocated. Also, another design goal in many electronic devices having both high-voltage and low-voltage circuit regions is to provide magnetic isolation between the high-voltage and low-voltage regions. Prior art electrical and mechanical circuit board connectors generally do not provide magnetic isolation between high-voltage and low-voltage circuit regions.

Typically, in an electrical device such as a power supply, a circuit board is surrounded by an enclosure to prevent circuit components from being exposed to the environment. During use, magnetic circuit components generate heat locally inside the enclosure. Heat must be dissipated from the component to ensure proper functionality and to prevent circuit damage, component failure, or fire. One mode of heat dissipation from a surface-mounted magnetic circuit component includes heat conduction through a thermal linkage between the magnetic component and the enclosure wall, whereby the enclosure serves as a heat sink. Prior art surface-mount magnetic component configurations, however, limit the ability of a magnetic circuit component to be thermally coupled to an enclosure wall because prior art surface-mount configurations generally place a circuit board between the magnetic component and the enclosure wall. Conventional circuit board placement blocks direct thermal contact between the magnetic component and the enclosure wall. Moreover, the close proximity of the circuit board to the surface-mounted magnetic component in the prior art allows heat conduction by the circuit board, potentially causing damage to nearby circuit components.

Others have attempted to solve the problems associated with surface-mounted magnetic component heat dissipation by positioning the magnetic component farther away from the surface of the printed circuit board, using a series of mechanical standoffs to provide an air gap between the component and the circuit board. Because a magnetic component is often the tallest component in a circuit, such prior art raised surface-mount configurations generally increase the maximum height of the circuit extending above the surface of the circuit board, necessitating the use of a larger enclosure. Generally, it is desirable to produce electronic devices having smaller device profiles and increased volumetric power density. In contrast, the prior art approach causes an undesirable increase in the overall size of the electrical device and reduces volumetric power density. Others have also attempted to address the problem of surface-mounted magnetic component heat transfer by adding heat removal structures, such as heat sinks and fins to surface-mounted magnetic components. These structures, however, also take up additional space within the electronic device enclosure, thereby increasing electronic device profile and reducing power density.

Accordingly, there is a need in the art for providing a magnetic circuit board connector component for mechanically and electrically connecting circuit boards. The magnetic circuit board connector component must eliminate unnecessary circuit board material, improve heat dissipation from the magnetic component, provide structural support to a circuit board, allow single-sided circuit boards to be used with double-sided printed circuit boards in one circuit, provide magnetic isolation between high-voltage and low-voltage circuit regions, and reduce device profile while increasing power density. Also desired is a circuit board assembly having two or more circuit boards mechanically and electrically interconnected by a magnetic component.

BRIEF SUMMARY OF THE INVENTION

The present invention includes a magnetic component for connecting two or more circuit boards. The magnetic component includes a bobbin structure having a hollow interior cavity. The bobbin structure has a first end and a second end. A first support step is positioned on the first end of the bobbin structure. Similarly, a second support step may be positioned on the second end of the bobbin structure. Each step provides mechanical support between the magnetic component and a circuit board. Each step may also include a side shaped for thermal contact with another surface, such as an enclosure wall, for heat dissipation. One or more conductive terminals extend from the support step for electrically connecting the support step to a circuit board. Each conductive terminal connects to an electrical connection location on the adjacent circuit board.

The bobbin structure may include a winding region located between the first and second ends. A conductive winding may be wrapped around the winding region of the bobbin structure. The bobbin winding may include one or more turns around the bobbin structure. A first ferrite core may also be positioned on the bobbin structure. A second ferrite core may be positioned adjacent to the first ferrite core to form a closed-loop magnetic flux path around or through the bobbin structure.

The present invention also includes a circuit board assembly having two or more circuit boards electrically and mechanically interconnected by a magnetic component. A first circuit board generally includes a first circuit positioned thereon, and a second circuit board generally includes a second circuit. The first and second circuits are electrically connected through the magnetic component. The electrical connection between the first and second circuit boards may be provided either by magnetic coupling through the magnetically permeable core positioned on the magnetic component or by a direct electrical connection extending between the circuit boards through the magnetic component. As used herein, a first conductor is magnetically coupled to a second conductor where a flow of current through the first conductor generates a magnetic field in a nearby core material that induces a flow of current through the second conductor. Also, as used herein, a first conductor is electrically connected to a second conductor where sufficient electrical contact exists between the conductors to allow a flow of electrons between the conductors. In one embodiment the first and second circuit boards are electrically connected both through a direct electrical connection and through magnetic coupling.

The circuit boards are mechanically connected to the magnetic component at circuit board engagement surfaces positioned on the bobbin structure. The circuit board engagement surfaces may be located on the first or second step. Also, a first flange may extend from the first end of the bobbin structure. The first flange includes a first flange surface shaped for supporting the first circuit board. A second flange may also extend from the second end of the bobbin structure, including a second flange surface shaped for supporting the second circuit board. Additional third and fourth flanges may extend from the first and second ends of the bobbin structure to support the first and second circuit boards.

It is therefore a general object of the present invention to provide a magnetic component for electrically interconnecting two circuit boards.

It is another object of the present invention to provide a bobbin structure for mechanically supporting two circuit boards.

It is yet another object of the present invention to provide a magnetic component for eliminating a section of circuit board material in a circuit.

It is yet another object of the present invention to provide a magnetic component for connecting a single-sided printed circuit board and a double-sided printed circuit board in a single circuit.

It is yet another object of the present invention to provide a magnetic circuit board connector component allowing isolation of high-voltage and low-voltage circuit regions.

Another object of the present invention is to provide a magnetic circuit board connector component for increasing power density, decreasing the height of the electric circuit and reducing the device profile.

It is yet another object of the present invention to provide a magnetic circuit board connector component for improving heat transfer from the magnetic component to the enclosure wall.

Another object of the present invention is to provide a circuit board assembly having two or more circuit boards connected by a magnetic component.

Numerous other objects, features and advantages of the present invention will be readily apparent to those skilled in the art, upon a reading of the following disclosure, when taken in conjunction with the accompanying drawings.

DETAILED DESCRIPTION OF THE INVENTION

Figure 1:
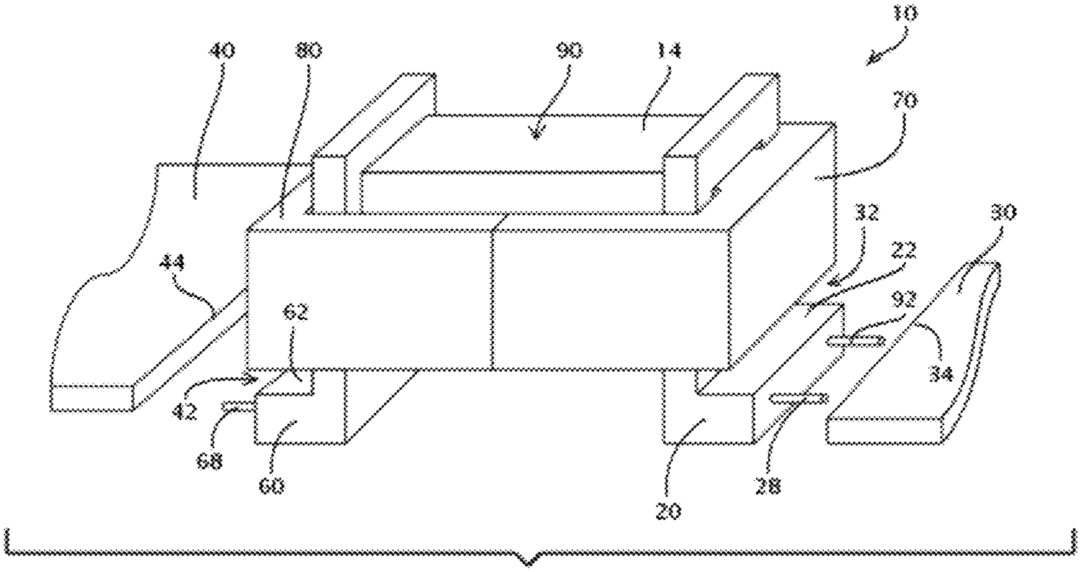
FIG. 1 is a perspective view of a magnetic component in accordance with the present invention.
Figure 2:
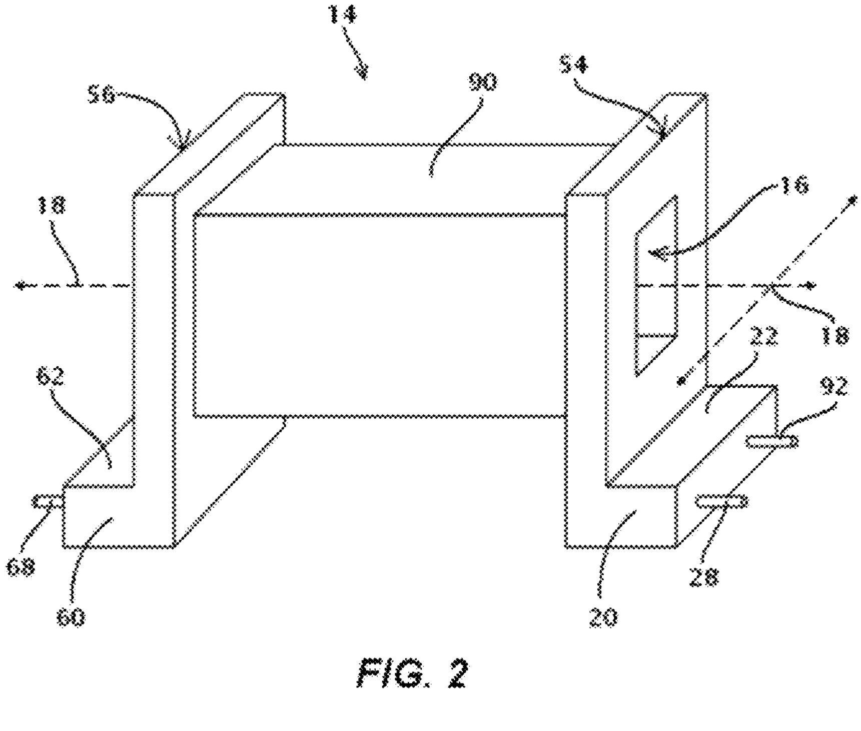
FIG. 2 is a perspective view of a bobbin structure forming part of the magnetic component of FIG. 1.

The magnetic component of the present invention is used as a circuit board connector. The magnetic component includes a bobbin structure that is generally adapted for mounting onto an edge of a circuit board. In one embodiment, a second circuit board is also connected to the magnetic component. Referring now to FIGS. 1 and 2, a magnetic component 10 in accordance with the present invention is generally shown. The magnetic component 10 includes a bobbin structure 14 having a winding region 90 and a hollow interior cavity 16.

The bobbin structure 14 includes a first step 20. The first step 20 has a first circuit board engagement surface 22 adapted for supporting a first circuit board 30. In one embodiment, the bobbin structure 14 also includes a second step 60. The second step 60 has a second circuit board engagement surface 62 shaped for supporting the second circuit board 40. In one embodiment, a first core 70 is positioned on the bobbin structure 14, and a second core 80 is also positioned on the bobbin structure 14. Generally, each core 70, 80 is made of a magnetically permeable material and can extend into the interior cavity 16 of the bobbin structure 14. In one embodiment, each core 70, 80 includes a ferrite material.

Referring further to FIG. 1, in one embodiment the first circuit board engagement surface 22 defines a first gap 32 between the first step 20 and the first core 70. The first gap 32 is generally shaped for receiving the first edge 34 of the first circuit board 30. Similarly, in one embodiment the second circuit board engagement surface 62 defines a second gap 42 located between the second core 80 and the second step 60. The second gap 42 is generally shaped for receiving the second edge 44 of the second circuit board 40.

Figure 4A:
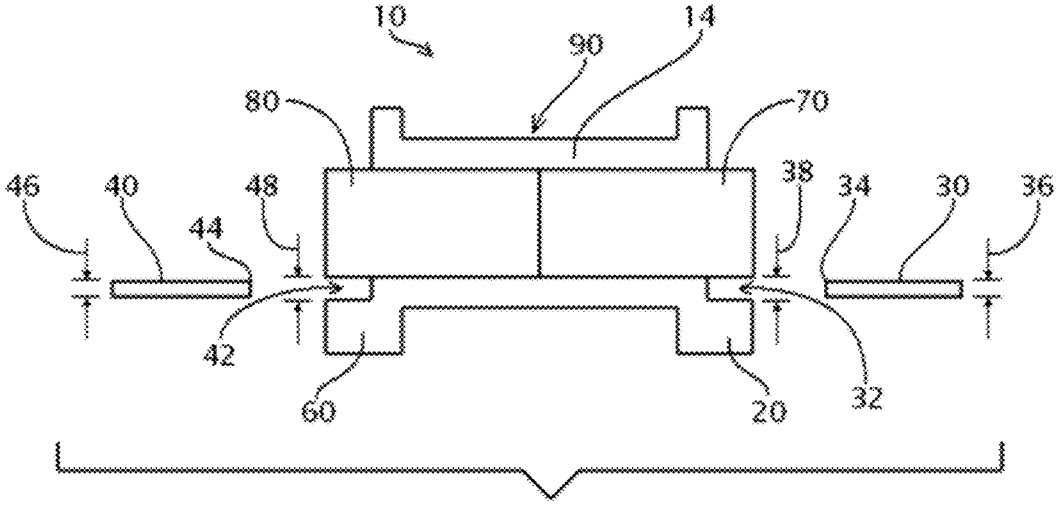
FIG. 4*a* is an exploded side elevation view of a circuit board assembly in accordance with the present invention.
Figure 4B:
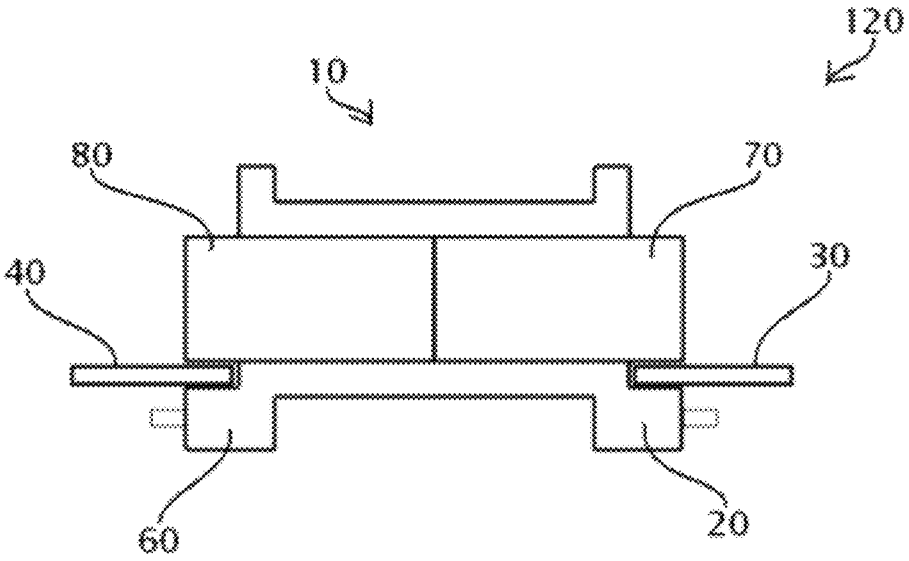
FIG. 4*b* is a side elevation view of the circuit board assembly of FIG. 4*a*.

As seen in FIG. 4*a* and FIG. 4*b*, the first circuit board 30 has a first circuit board thickness 36, and the first gap 32 has a first gap height 38. In one embodiment, the ratio of the first circuit board thickness 36 to the first gap height 38 is substantially between 0.5 and 1.0. Also shown in FIG. 4*a*, the second circuit board 40 has a second circuit board thickness 46, and the second gap 42 has a second gap height 48. In one embodiment, the ratio of the second circuit board thickness 46 to the second gap height 48 is substantially between 0.5 and 1.0.

Figure 3:
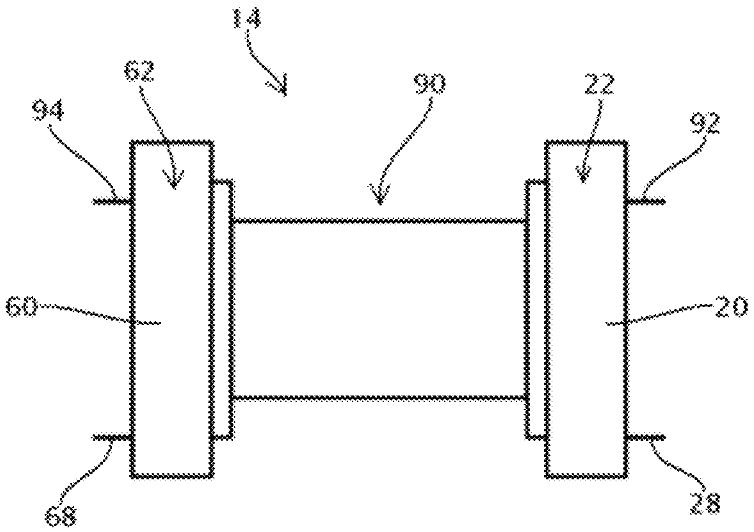
FIG. 3 is a top view of a bobbin structure in accordance with the present invention.

Referring now to FIG. 2 and FIG. 3, one embodiment of a bobbin structure 14 in accordance with the present invention is shown. The bobbin structure 14 has a first end 54, a second end 56, a first step 20 and a second step 60. A first circuit board engagement surface 22 is positioned on the first step 20 substantially facing a reference plane 18 extending longitudinally through the bobbin structure 14. A second circuit board engagement surface 62 is positioned on the second step 60 substantially facing the same reference plane 18. In other embodiments, the first circuit board engagement surface 22 and the second circuit board engagement surface 62 may face in different directions. In one embodiment, a first conductive terminal 28 is positioned on the first step 20, a second conductive terminal 68 is positioned on the second step 60, a third conductive terminal 92 is positioned on the first step 20, and a fourth conductive terminal 94 is positioned on the second step 60, as shown in FIG. 3. In one embodiment, each conductive terminal 28, 68, 92, 94 extends from the bobbin structure 14, as shown in FIG. 2 and FIG. 3. In other embodiments, various other conductive terminal configurations may be located on the bobbin structure.

Figure 4C:
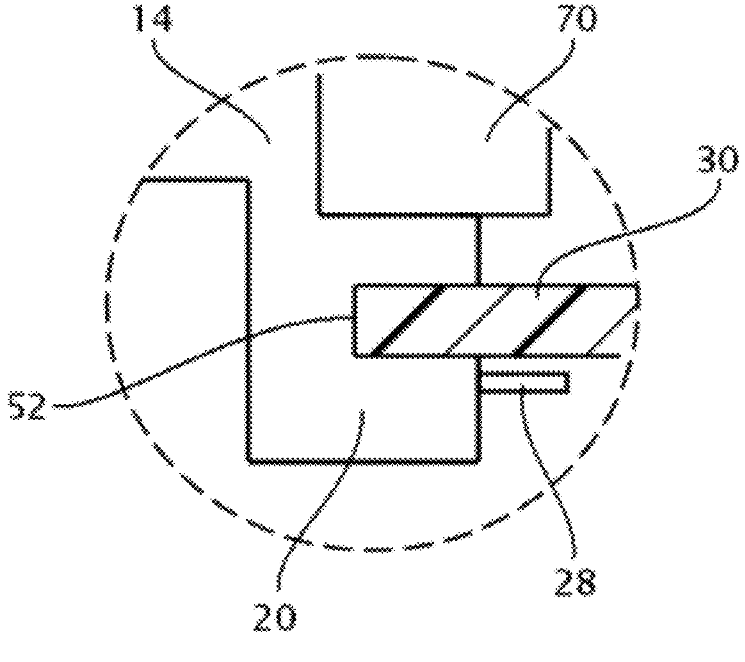
FIG. 4*c* is a detail view of a bobbin structure in accordance with the present invention.

Referring now to FIG. 4*a* and FIG. 4*b*, a circuit board assembly or apparatus 120 in accordance with the present invention is shown. The circuit board apparatus 120 includes a first circuit board 30 and a second circuit board 40 connected by a magnetic component 10, as seen in FIG. 4*b*. The magnetic component 10 includes a first core 70 and a second core 80. The first circuit board 30 can be positioned in the first gap 32 located between the first core 70 and the first step 20 of the bobbin structure 14. In one embodiment, the first edge 34 of the first circuit board 30 is inserted into the first gap 32. The second circuit board 40 includes a second circuit board edge 44 that can be inserted into the second gap 42, as seen in FIG. 4*b*. In another embodiment, seen in FIG. 4*c*, the first step 20 may define a groove 52. The first circuit board 30 may be inserted into groove 52 to mechanically connect the first circuit board 30 to the magnetic component 10.

Figure 5:
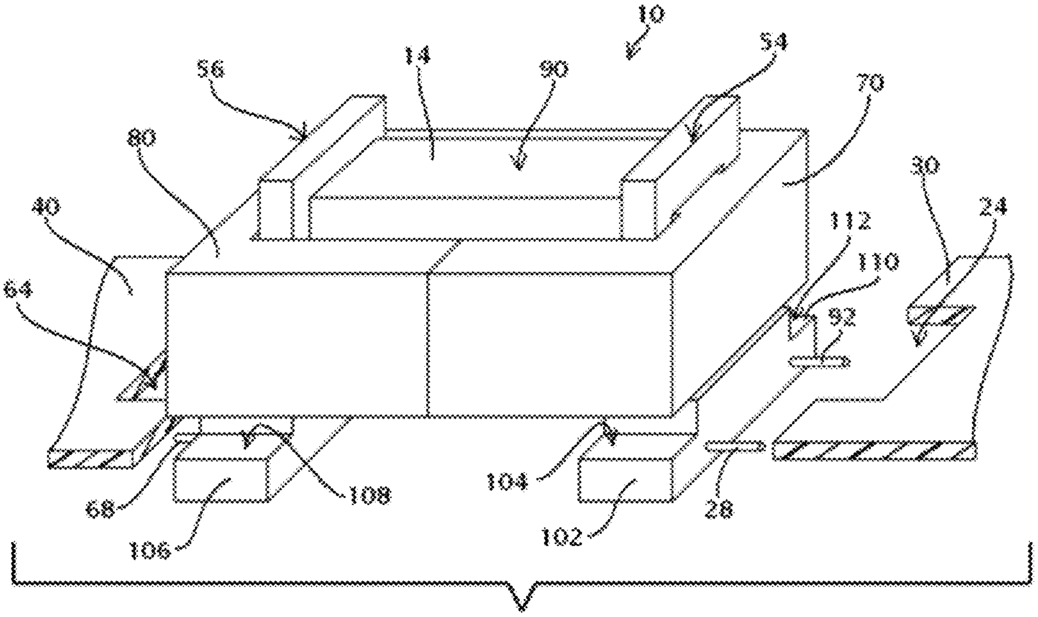
FIG. 5 is a perspective view of a magnetic component in accordance with the present invention.
Figure 6:
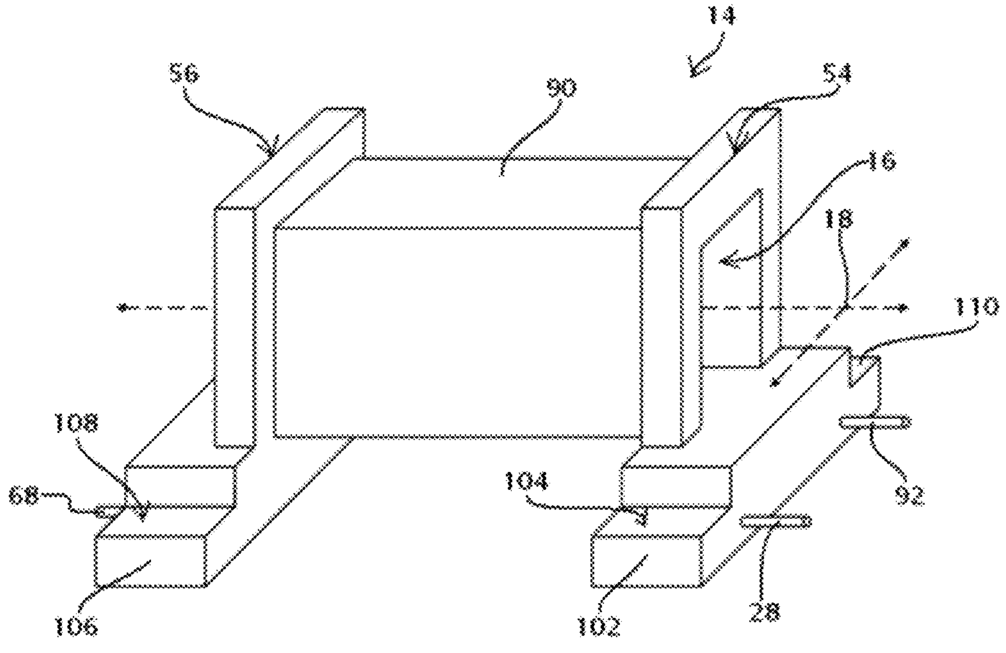
FIG. 6 is a perspective view of the bobbin structure forming part of the magnetic component of FIG. 5.

Referring now to FIG. 5, another embodiment of a magnetic component 10 is generally shown. The magnetic component 10 includes a bobbin structure 14 having a first end 54 and a second end 56. The first end 54 of the bobbin structure 14 has a first flange 102 shaped for supporting a first circuit board 30. The first flange 14 includes a first flange surface 104 for engaging the first circuit board 30. A second flange 106 also extends from the second end of the bobbin structure 14. The second flange 106 includes a second flange surface 108. The first flange surface 104 and second flange surface 108 generally face in the direction of the reference plane 18 extending through the bobbin structure 14, as shown in FIG. 6.

Figure 7:
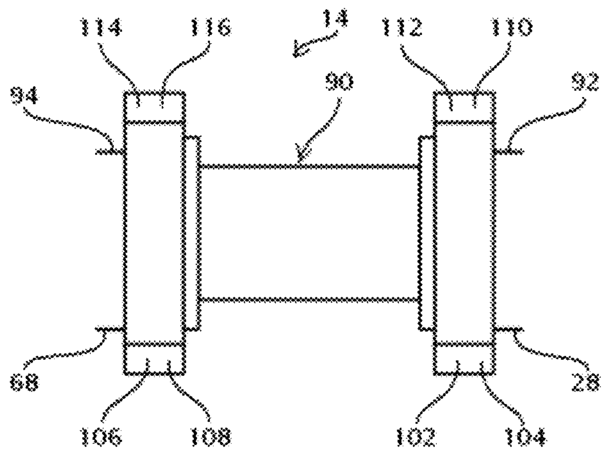
FIG. 7 is a top view of a bobbin structure in accordance with the present invention.

As seen in FIG. 7, the bobbin structure 14 may also include a third flange 110 having a third flange surface 112 and a fourth flange 114 having a fourth flange surface 116. Referring again to FIG. 5, in one embodiment, the first circuit board 30 includes a first circuit board notch 24 shaped for engaging the first end 54 of the bobbins structure 14. The second circuit board 40 may have a second circuit board notch 64 shaped for engaging the second end 56 of the bobbin structure 14.

Figure 8:
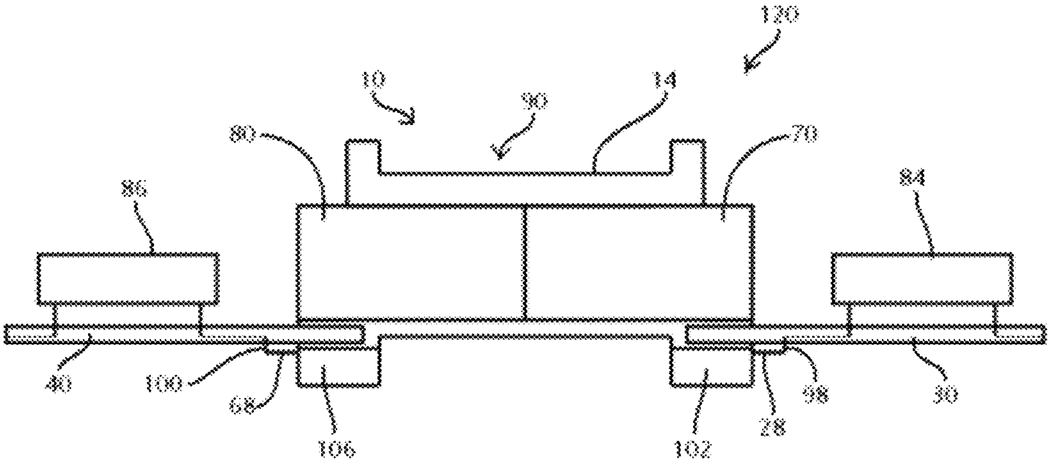
FIG. 8 is a side elevation view of a circuit board assembly in accordance with the present invention.

As seen in FIG. 8, one embodiment of a circuit board assembly 120 in accordance with the present invention includes a first circuit board 30 and a second circuit board 40 connected by a magnetic component 10. The first circuit board 30 includes a first circuit 84. The first circuit 84 is electrically connected to the magnetic component 10 through the first conductive terminal 28. The first circuit board 30 is mechanically attached to the magnetic component 10 by engaging the first flange 102.

A second circuit 86 is included on the second circuit board 40. The second circuit 86 is electrically connected to the magnetic component 10 through the second conductive terminal 68. The second circuit board is mechanically attached to the magnetic component by engaging the second flange 106.

In additional embodiments, the first circuit board 30 may be both mechanically and electrically connected to the magnetic component 10 at a first soldered terminal 98. Similarly, the second circuit board 40 may be both electrically and mechanically connected to the magnetic component 10 at a second soldered terminal 100. In one embodiment, the first circuit 84 is electrically connected to the second circuit 86 by magnetic coupling through the first and second cores 70, 80 of the magnetic component 10. In another embodiment, a direct electrical connection may extend through the bobbin structure 14 to connect the first and second circuits 84, 86.

Figure 9:
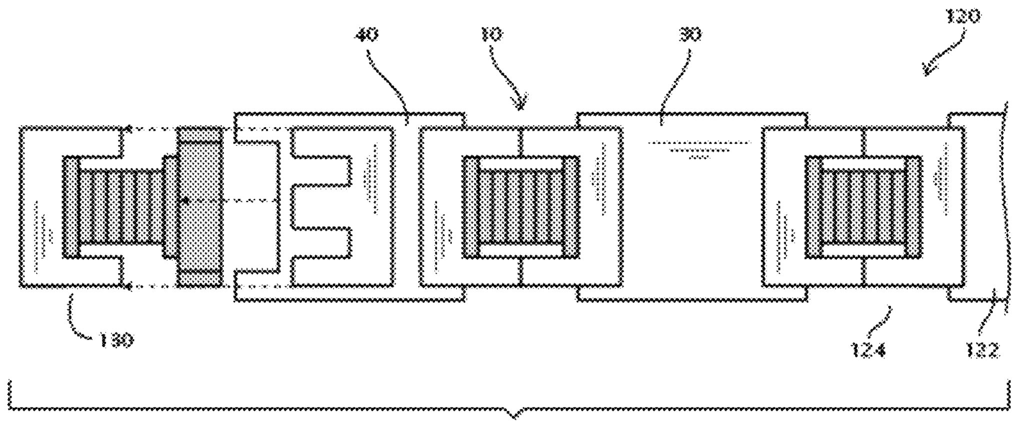
FIG. 9 is a top view of a circuit board assembly in accordance with the present invention.

Referring now to FIG. 9, a circuit board assembly 120 in accordance with the present invention is shown. The circuit board assembly 120 includes a first circuit board 30 connected to a second circuit board 40 and a third circuit board 122 through a first magnetic component 10 and a second magnetic component 124. A third magnetic component 130 can be mounted onto the second circuit board 40 to provide mechanical support to the second circuit board 40 or to connect additional circuit boards to the circuit board assembly 120. In one embodiment, the third circuit board 122 is electrically connected to the second circuit 40 through first and second magnetic components 10, 124. The circuit board assembly 120 may include additional circuit boards and magnetic components interconnecting each additional circuit board. Additionally, the circuit board assembly 120 may include both single-sided and double-sided circuit boards interconnected in one circuit through magnetic components. In one embodiment, the first circuit board 30 is a single-sided magnetic component and the second circuit board 40 is a double-sided circuit board.

Thus, although there have been described particular embodiments of the present invention of a new and useful magnetic circuit board connector component it is not intended that such references be construed as limitations upon the scope of this invention except as set forth in the following claims.

What is claimed is:

1. A magnetic component for connecting first and second circuit boards, comprising:

a bobbin structure having a first end and a second end, the bobbin structure defining a reference plane extending longitudinally through the bobbin structure;

a first step extending from the first end of the bobbin structure, the first step including a first circuit board engagement surface oriented substantially facing the reference plane;

a second step extending from the second end of the bobbin structure, the second step including a second circuit board engagement surface oriented substantially facing the reference plane;

a first core positioned on the first end of the bobbin structure;

a second core positioned on the second end of the bobbin structure;

the first circuit board engagement surface defining a first gap between the first step and the first core, the first gap having a first gap height; and the second circuit board engagement surface defining a second gap between the second step and the second core, the second gap having a second gap height.

2. The magnetic component of claim 1, wherein the first and second cores each comprise a ferrite.

3. The magnetic component of claim 1, wherein:

the first circuit board has a first circuit board thickness;

the second circuit board has a second circuit board thickness;

the ratio of the first circuit board thickness to the first gap height is substantially between 0.5 and 1.0; and the ratio of the second circuit board thickness to the second gap height is substantially between 0.5 and 1.0.

4. The magnetic component of claim 3, wherein:

the first circuit board thickness is substantially equal to the first gap height; and the second circuit board thickness is substantially equal to the second gap height.

5. A magnetic component for connecting first and second circuit boards, comprising:

a bobbin structure having a first end and a second end, the bobbin structure defining a reference plane extending longitudinally through the bobbin structure;

a first step extending from the first end of the bobbin structure, the first step including a first circuit board engagement surface oriented substantially facing the reference plane;

a second step extending from the second end of the bobbin structure, the second step including a second circuit board engagement surface oriented substantially facing the reference plane; and wherein the first step defines a first groove shaped for receiving the first circuit board.

6. The magnetic component of claim 1, further comprising:

a first conductive terminal extending from the first step; and a second conductive terminal extending from the second step.

7. The magnetic component of claim 6, further comprising:

a third conductive terminal extending from the first step; and a fourth conductive terminal extending from the second step.

8. The magnetic component of claim 6, further comprising a conductive winding disposed about the winding region of the bobbin structure.

9. The magnetic component of claim 7, wherein the first conductive terminal is electrically connected to the third conductive terminal.

10. The magnetic component of claim 8, wherein the first conductive terminal is electrically connected to the conductive winding.

11. A circuit board assembly, comprising:

a first circuit board having a first edge;

a magnetic component connected to the first circuit board, the magnetic component comprising:

a bobbin structure including a first end and a second end, a core positioned on the bobbin structure, a conductive winding disposed about the bobbin structure, and a first step extending from the first end of the bobbin structure, the first step defining a first gap between the core and the first step, the first gap shaped for receiving the first edge of the first circuit board; and the first edge of the first circuit board positioned in the first gap.

12. The circuit board assembly of claim 11, further comprising:

the first circuit board including a first electric circuit; and a first conductive terminal positioned on the bobbin structure, the first conductive terminal electrically connected to the first electric circuit.

13. The circuit board assembly of claim 11, further comprising:

a second circuit board having a second edge;

a second core positioned on the bobbin structure;

a second step extending from the second end of the bobbin structure, the second step defining a second gap between the second core and the second step, the second gap shaped for receiving the second edge of the second circuit board; and the second edge of the second circuit board positioned in the second gap.

14. The circuit board assembly of claim 13, further comprising:

the second circuit board including a second electrical circuit; and a second conductive terminal positioned on the bobbin structure, the second conductive terminal electrically connected to the second electrical circuit.

15. The circuit board assembly of claim 13 wherein the magnetic component is a transformer.

16. The circuit board assembly of claim 14, wherein the first circuit is magnetically coupled to the second circuit.

17. The circuit board assembly of claim 16, wherein the first circuit board is a single-sided printed circuit board and the second circuit board is a double-sided printed circuit board.

* * * * *